United States Patent [19]
Cho

[11] Patent Number: 5,767,710
[45] Date of Patent: Jun. 16, 1998

[54] POWER-UP RESET SIGNAL GENERATING CIRCUIT FOR AN INTEGRATED CIRCUIT

[75] Inventor: Il-Jae Cho, Kyungki-do, Rep. of Korea

[73] Assignee: Samsung Electronics Co., Ltd., Suwon, Rep. of Korea

[21] Appl. No.: 645,899

[22] Filed: May 14, 1996

[30] Foreign Application Priority Data

May 16, 1995 [KR] Rep. of Korea ............... 1995/12087

[51] Int. Cl.[6] ..................... H03K 17/22; H03K 17/687
[52] U.S. Cl. .......................................... 327/143; 327/198
[58] Field of Search ........................ 327/142, 143, 327/198, 379, 383, 389, 391, 427, 437, 534, 535, 537, 541, 543

[56] References Cited

U.S. PATENT DOCUMENTS

| | | | |
|---|---|---|---|
| 4,461,963 | 7/1984 | Koomen | 327/143 |
| 5,030,845 | 7/1991 | Love et al. | 327/143 |
| 5,130,569 | 7/1992 | Glica | 327/143 |
| 5,321,317 | 6/1994 | Pascucci et al. | 327/143 |
| 5,349,244 | 9/1994 | Confalonieri | 327/143 |
| 5,374,923 | 12/1994 | Sakamoto | 327/546 |
| 5,396,115 | 3/1995 | Coffman et al. | 327/198 |

FOREIGN PATENT DOCUMENTS 430399  6/1991  European Pat. Off. ............ 327/143

Primary Examiner—Timothy P. Callahan
Assistant Examiner—My-Trang Nu Ton
Attorney, Agent, or Firm—Marger, Johnson, McCollom & Stolowitz, P.C.

[57] ABSTRACT

A power-up reset signal generating circuit ensures proper operation of an integrated circuit upon power up by inhibiting operation, or forcing predetermined logic states, until the applied power supply voltage reaches at least an acceptable operating voltage level. The present circuit monitors both the supply voltage and a separate back bias voltage that appears in high density integrated circuits such as DRAM circuits. The reset signal initially rises in proportion to the applied supply voltage, and then is pulled down to a logic low level in response to assertion of the back bias voltage, thereby forming a logic transition in the reset signal. Qualifying the reset signal by monitoring the on-board back bias voltage generator ensures that the supply voltage has reached an acceptable operating level, even in circuits where the nominal MOS threshold voltage is reduced, because the reset signal does not change state until the back bias voltage generator is functioning.

10 Claims, 2 Drawing Sheets

POWER-UP RESET SIGNAL GENERATING CIRCUIT FOR AN INTEGRATED CIRCUIT

BACKGROUND OF THE INVENTION

Field of the Invention

This application claims priority from Korean application No. 12087/1995, filed May 16, 1995. The prior Korean application is hereby incorporated by this reference.

The present invention relates to improved method sand circuitry for generating a reset signal each time that power is applied to an integrated circuit from an external power supply. More specifically, the present invention is directed to reliably providing a power-up reset signal in a densely integrated circuit, such as a DRAM, in which a field effect transistor (FET) threshold voltage Vt is lower than a nominal value or not well known.

SUMMARY OF PRIOR ART

Frequently, an integrated circuit device includes logic or other circuits that must be preset to known states, or inhibited, while the device is being powered up by an external power supply. Generally, the supply voltage Vdd must exceed a combined threshold voltage Vtp+Vtn, where Vtp is the threshold voltage of a PMOS transistor and Vtn is the threshold voltage of an NMOS transistor, to ensure proper circuit operation. Thus it is known to use the threshold voltages of PMOS and NMOS devices (i.e., P-channel and N-channel MOS field effect transistors, respectively) to initiate a power-up reset signal. However, known circuits are prone to malfunction when the supply voltage Vdd is below the level of Vtn+Vtp. The difficulty is exacerbated because threshold voltages are not well known in some cases. The threshold voltage Vt is lower in higher density circuits, such as DRAM devices.

A known power-up reset pulse generator circuit is described in U.S. Pat. No. 5,030,845 to Andrew M. Love. FIG. 1 of the present application illustrates a configuration of the type described in the Love patent. Referring to FIG. 1, reference numbers 10, 11, 14a and 15 indicate PMOS transistors. Reference numbers 12 and 16 indicate NMOS transistors. Reference number 13 indicates an NMOS capacitor, and 14b indicates a PMOS capacitor. On power-up, capacitor 14b causes the voltage at the output terminal OUT to increase response to the rising supply voltage Vdd as power is applied, while capacitor 13 holds the internal node N1 at the reference voltage Vss. When Vdd reaches one P-channel threshold voltage Vt, the load transistor 14a turns on and maintains the voltage at the output node OUT at Vdd while Vdd rises further. The voltage at output node OUT increases with Vdd until the voltage reaches 2 P-channel Vts (assuming the top transistor 10 in FIG. 1 is bypassed by switch SW1), at which point the pull-up string turns on and pulls the internal node Ni to Vdd-Vtp. If the N-channel threshold voltage Vtn is less than or equal to the P-channel threshold voltage, this begins to turn on the N-channel output detector transistor 16. If the N-channel threshold is greater than the P-channel threshold, then the output detector 16 does not on until Vdd reaches Vtn+Vtp. Thus proper operation of the prior art circuit depends upon Vtn having at least a certain minimum value.

Referring again to FIG. 1, when Vdd exceeds the threshold voltage Vtp of the PMOS transistors 10 and 11, as noted, the voltage at node NI equals Vdd-Vtp11-Vtp10 where Vtp11 and Vtp10 refer to the threshold voltages of PMOS transistors 11 and 10, respectively. The NMOS transistor 16 which is connected to node N1 will be turned on prematurely if it has a relatively low threshold voltage level. Once transistor 16 turns on, the voltage at the output terminal OUT goes low, thereby completing a positive pulse indicating that Vdd has reached a proper level to activate all other circuits. Thus it can be appreciated that the prior art circuit depends upon the threshold voltage level of the NMOS device for proper operation.

In high density integrated circuits such as DRAMs, the threshold voltage is lower than the usual levels, so transistor 16 is likely to turn on and output the power up pulse prematurely. The need remains, therefore, to provide a reliable power-on signal in an integrated circuit.

SUMMARY OF THE INVENTION

Accordingly, it is an object of the present invention to provide an improved power-up reset signal generating circuit for accurately generating a reset signal in a high density integrated circuit device.

Another object of the invention is to provide a circuit for accurately generating a power-up reset signal even in circuits where the threshold voltage of an NMOS transistor is relatively low, i.e., before a back bias voltage is applied to the NMOS transistor.

A further object of the present invention is to provide a power-up reset signal generating circuit that is relatively immune to threshold voltage variations in NMOS devices due to variations in the circuit fabrication process, thereby providing for proper operation even in densely integrated circuit devices.

According to one aspect of the invention in a preferred embodiment, a power-up reset signal generating circuit is described for use in an integrated circuit that employs field-effect transistors, such as MOS transistors. The integrated circuit includes a back bias voltage source and a supply voltage input terminal, and the new the circuit includes the following aspects. A pull-up circuit is coupled to the supply voltage input terminal to receive the supply voltage (Vdd). It provides a pull-up control signal at a first internal node in response to the supply voltage exceeding a predetermined first voltage level such as a PMOS threshold voltage level, Vtp. A first field effect transistor, e.g. PMOS, has a gate terminal coupled to the first internal node and has its source-drain path coupled between the input terminal (Vdd) and a second internal node. Accordingly, the supply voltage appears at the second internal node as long as the pull-up control signal is asserted. Thus the second internal node voltage rises with the supply voltage to a logic high state during the initial power-up of the circuit. A reset signal output control circuit is coupled to the back bias voltage source and to the second internal node for driving the second internal node voltage to a low logic state in response to the magnitude of the back bias voltage exceeding a second predetermined voltage level. When this occurs, the second internal node voltage changes from the logic high state to the logic low state. Accordingly, the reset signal at the second internal node falls only after the supply voltage exceeds the said first voltage and the back bias voltage exceeds a predetermined second voltage. The back bias voltage is monitored because it will not be sufficient to pull down the reset signal until the supply voltage exceeds a combined threshold voltage Vtp+Vtn. This will ensure proper operation of other circuits that follow the reset circuit.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
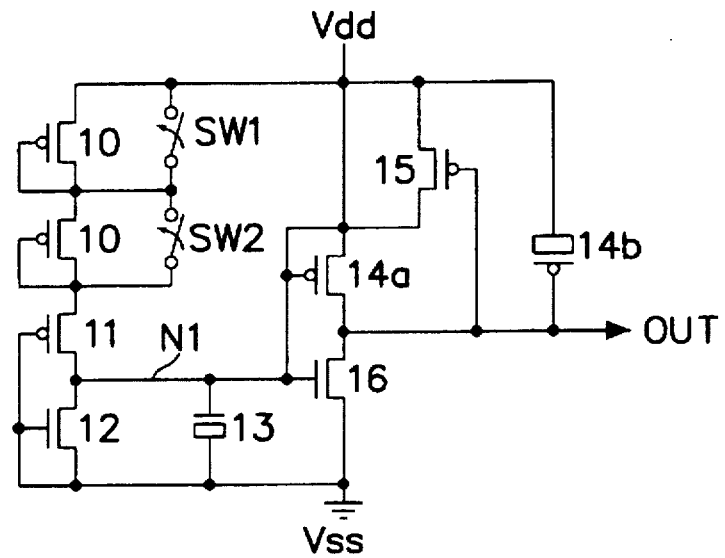
FIG. 1 is a schematic diagram illustrating a prior art power-up reset signal generating circuit.
Figure 2:
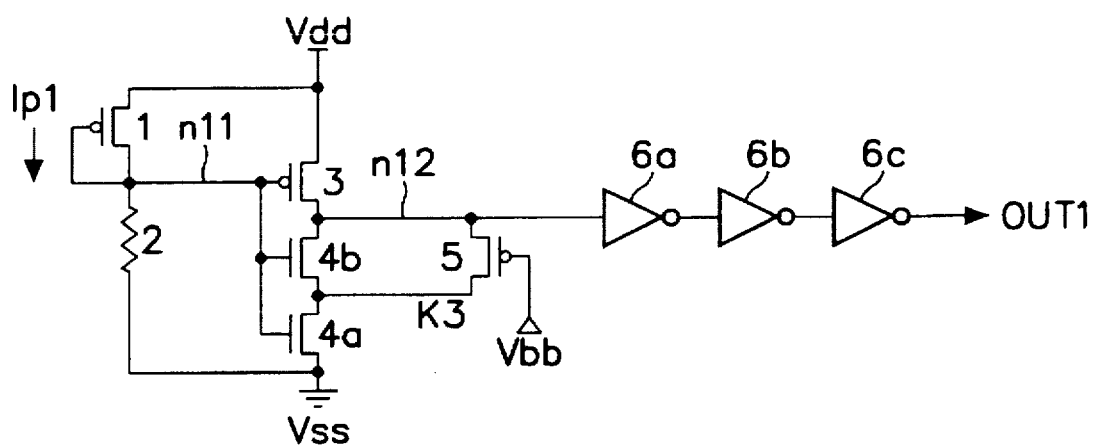
FIG. 2 is a schematic diagram illustrating a power-up reset signal generating circuit according to the present invention.

Referring now to FIG. 2, a PMOS transistor 1 has a source terminal connected to the supply terminal Vdd. The gate and drain terminals of PMOS transistor 1 are connected together to a first internal node n11. Resistor R2 is connected between the internal node n11 and a reference potential Vss. This combination may be referred to as a pull-up circuit, as it outputs a pull-up control signal at node n11 that varies in voltage in proportion to the applied supply voltage Vdd (once Vdd exceeds the threshold voltage Vtp). The voltage at internal node n11 is determined by the source to drain current Ip1 through the PMOS transistor 1. Thus, the voltage Vn11 equals Ip1xR, where R is the value of resistor 2. In a preferred embodiment, in order to minimize power consumption during standby operation of the power up reset circuit (i.e., when the integrated circuit is operating normally), PMOS transistor 1 has a channel length which is approximately 10 times as long as that of the usual PMOS transistor (for the fabrication process at hand) and resistor 2 has a resistance of several hundred k-ohms. Accordingly, the standby current drain through transistor 1 is quite small.

The pull-up control signal at node n11 is applied to the gate of a PMOS transistor 3, also connected at its source terminal to the supply voltage Vdd. PMOS transistor 3 has a drain terminal coupled to a second internal node n12. A reset signal output control circuit is formed of NMOS transistors 4a and 4b and a PMOS transistor 5 as described next. The NMOS transistor 4b has a drain terminal connected to node n12. The drain terminal of NMOS transistor 4a is connected to the source of NMOS transistor 4b, and the source of NMOS transistor 4a is connected to the reference node Vss so that transistors 4b and 4a are arranged in series. The gates of the NMOS transistors 4b and 4a are connected to the first internal node n11 so that they are controlled by the pull-up control signal. PMOS transistor 5 is connected to the drain and source of the NMOS transistor 4b at a source and drain thereof, respectively, such that these devices are arranged in parallel.

A back bias voltage generator is provided in high density circuits to provide a back bias voltage, e.g. −1 to −2 volts, applied to the substrate of N-channel transistors. It has the effect of increasing the device threshold voltage Vtn. In FIG. 2, a back bias voltage Vbb generated by the back bias voltage generator (not shown) is supplied to the gate of PMOS transistor 5. In this configuration, the channel length of NMOS transistor 4b is preferably about fifteen times as long as that of the usual NMOS transistor in the integrated circuit. NMOS transistor 4a and the PMOS transistor 5 have the same channel length as that of the usual MOS field effect transistors. Accordingly, the second internal node voltage Vn12 is not pulled down even though the rising supply voltage at Vn11 tends to turn on transistor 4b.

Figure 3:
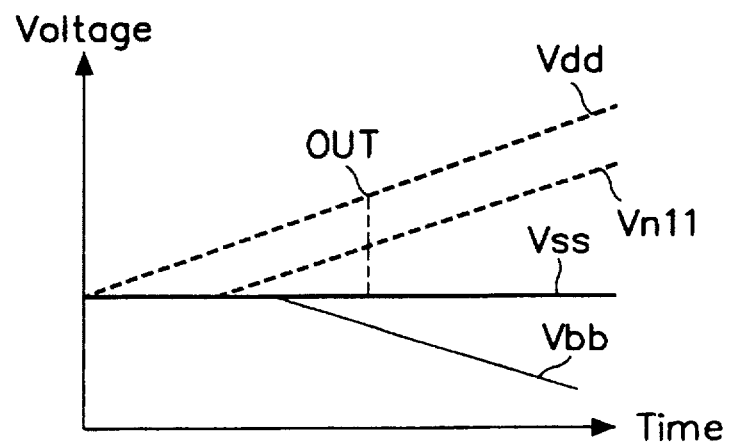
FIG. 3 is a voltage plot illustrating operation of the power-up reset signal generating circuit of FIG. 2.

In operation, the pull-up control signal voltage at node n11 (Vn11) ramps up in proportion to the supply voltage Vdd, as illustrated in the voltage plot of FIG. 3. The voltage at internal node n12 (Vn12), i.e. the drain voltage of PMOS transistor 3, likewise increases in proportion to the supply voltage Vdd. Notwithstanding an increase in the supply voltage Vdd up to the combined threshold voltage Vtn+Vtp, PMOS transistor 5 stays off, initially, because the supply voltage is insufficient to turn on the back bias voltage generator. Once Vdd exceeds the combined threshold voltage, the back bias voltage Vbb turns on transistor 5, pulling node n12 low, as current flows through transistors 5 and 4a. Internal node n12 is coupled to a series of inverters 6a, 6b and 6c, the latter providing the power up reset signal OUT 1. Accordingly, the logic low level at node n12 is inverted (thrice) to form a logic high level at OUT1. The reset signal OUT1 thus is held low while Vdd ramps up, and goes high after Vdd reaches the proper operating level.

As is common for MOS inverters generally, each of the inverters 6a, 6b and 6c comprises NMOS and PMOS transistors, and is used for buffering the voltage of the second internal node n12 to provide the reset signal to other circuits within the device. To minimize current flow and hence power consumption, the channel lengths of the NMOS and PMOS transistors employed in the inverters is designed to be much longer than that of the general MOS transistor.

To briefly summarize, the reset signal is controlled in part, or qualified, by using the back bias voltage Vbb which is applied to the substrates of the NMOS transistors. Thus, even where the nominal threshold voltage Vtn of the NMOS transistor is reduced, as in high density DRAM circuits, a stable reset signal can be generated.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A power-up reset signal generating circuit for use in an integrated circuit that employs field-effect transistors and includes a back bias voltage source and a supply voltage input terminal, the circuit comprising:

a pull-up circuit coupled to the supply voltage input terminal to receive a supply voltage, and including means for providing a pull-up control signal at a first internal node responsive to the supply voltage exceeding a predetermined first voltage level;

a first field effect transistor having a first channel type, and having a gate terminal coupled to the first internal node and having a source-drain path coupled between the input terminal and a second internal node so as to provide substantially the supply voltage at the second internal node in response to the pull-up control signal, such that the second internal node voltage rises to a logic high state during power-up of the supply voltage; and a reset signal output control circuit coupled to the back bias voltage source and to the second internal node for driving the second internal node voltage to a low logic state in response to a magnitude of the back bias voltage exceeding a second predetermined voltage level, whereby the second internal node voltage changes from the logic high state to the logic low state only after the supply voltage exceeds the first voltage and the back bias voltage exceeds the second voltage wherein the pull-up circuit includes a second field effect transistor having the first channel type, and having a gate terminal and a drain terminal coupled in common to the first internal node; and a resistor connected between said second transistor drain terminal and a reference voltage, so that the first internal node voltage rises substantially in proportion to the supply voltage provided the supply voltage exceeds a threshold voltage of the second field effect transistor.

2. A power-up reset signal generating circuit according to claim 1 wherein the second field effect transistor consists of a P-channel, MOS transistor having a channel length which is approximately 10 times as long as a predetermined default length according to the integrated circuit fabrication process, and said resistor has a resistance on the order of several hundred k-ohms, thereby minimizing a standby current drain through the second field effect transistor.

3. A power-up reset signal generating circuit according to claim 1 and further comprising buffer means coupled to the second internal node for providing a power-up reset logic signal responsive to the second internal node voltage.

4. A power-up reset signal generating circuit according to claim 3 wherein the buffer means includes at least one MOS inverter circuit.

5. A power-up reset signal generating circuit according to claim 1 wherein the reset signal output control circuit includes a third field effect transistor having the first channel type, the third transistor source-drain path being coupled between the second internal node and a reference voltage, and the third transistor gate terminal coupled to the back bias voltage source such that the third transistor turns on responsive to the magnitude of the back bias voltage exceeding the second predetermined voltage level and pulls down the second internal node voltage to the low logic state to provide the power-up reset signal wherein the reset signal output control circuit includes a fourth field effect transistor having a second channel type, the fourth transistor source-drain path being coupled in parallel to the third field effect transistor, and the fourth field effect transistor having a gate terminal coupled to the first internal node.

6. A power-up reset signal generating circuit according to claim 5 wherein the fourth field effect transistor (4b) has a channel length about fifteen times as long as a predetermined default channel length according to the integrated circuit fabrication process.

7. A power-up reset signal generating circuit according to claim 5 wherein the first channel type transistors are P-channel field effect transistors and the second channel type transistors are N-channel transistors.

8. A power-up reset signal generating circuit according to claim 5 wherein the first channel type transistors are P-channel MOS transistors and the second channel type transistors are N-channel MOS transistors.

9. A power-up reset signal generating circuit according to claim 5 wherein the reset signal output control circuit includes a fifth field effect transistor (4a) having the second channel type, the fifth transistor having a source-drain path coupled in series between the third transistor (5) and the reference voltage (Vss), and having a gate coupled to the first internal node (n11), so that when the third transistor is on, current flows from the second internal node through the third transistor and the fifth transistor to the reference voltage.

10. A method of generating a power-up reset signal comprising:

monitoring a supply voltage applied to a supply terminal to detect the supply voltage exceeding a first threshold voltage;

providing an internal node voltage that rises in proportion to the supply voltage after the supply voltage exceeds the first threshold voltage;

monitoring a back bias voltage; and when the back bias voltage exceeds a second threshold voltage, pulling down the internal node voltage so that the internal node voltage forms a transition from a logic high state to a logic low state further comprising buffering the internal node voltage so as to provide a buffered power-up reset signal.

\* \* \* \* \*

UNITED STATES PATENT AND TRADEMARK OFFICE
CERTIFICATE OF CORRECTION

PATENT NO.    : 5,767,710
DATED         : June 16, 1998
INVENTOR(S)   : Cho

It is certified that error appears in the above-identified patent and that said Letters Patent is hereby corrected as shown below:

Column 1,
Line 11, "method sand" should read -- methods and --.
Line 55, "Ni" should read -- N1 --.
Line 60, "does not on" should read -- does not turn on --.
Line 65, "NI" should read -- N1 --.

Column 2,
Line 36, "and the new the circuit" should read -- and the new circuit --.

Signed and Sealed this

Sixth Day of August, 2002

Attest:

JAMES E. ROGAN
Attesting Officer    Director of the United States Patent and Trademark Office